United States Patent
Nakagawa

(10) Patent No.: US 6,340,938 B1
(45) Date of Patent: Jan. 22, 2002

(54) DEMODULATING DEVICE, DEMODULATING METHOD AND SUPPLY MEDIUM WITH PREDETERMINED ERROR LENGTH

(75) Inventor: Toshiyuki Nakagawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/378,064

(22) Filed: Aug. 20, 1999

(30) Foreign Application Priority Data

Aug. 24, 1998 (JP) .......................................... 10-237593

(51) Int. Cl.[7] .......................... H03M 5/00; H03M 7/00; H03M 7/40
(52) U.S. Cl. ................. 341/58; 341/59; 341/67
(58) Field of Search .............................. 341/58, 59, 67; 375/286; 714/775

(56) References Cited

U.S. PATENT DOCUMENTS

| 5,574,448 A | * | 11/1996 | Weng et al. ................... 341/59 |
| 5,600,315 A | * | 2/1997 | Shimpuku et al. ............. 341/59 |
| 5,638,064 A | * | 6/1997 | Mori et al. .................... 341/58 |

* cited by examiner

*Primary Examiner*—Patrick Wamsley
(74) *Attorney, Agent, or Firm*—Frommer Lawrence & Haug LLP; William S. Frommer

(57) ABSTRACT

A demodulating device of the present invention in which an error code/constraint length determining unit, a minimum run continuation restricting code detecting unit and a minimum run/maximum run compensating code detecting unit specify a constraint length of a code having a predetermined length including an error and inverse conversion units and an error data demodulation table demodulate the code based on the specified constraint length, thus reducing error propagation by a simpler constitution when bit shift error is caused.

5 Claims, 12 Drawing Sheets

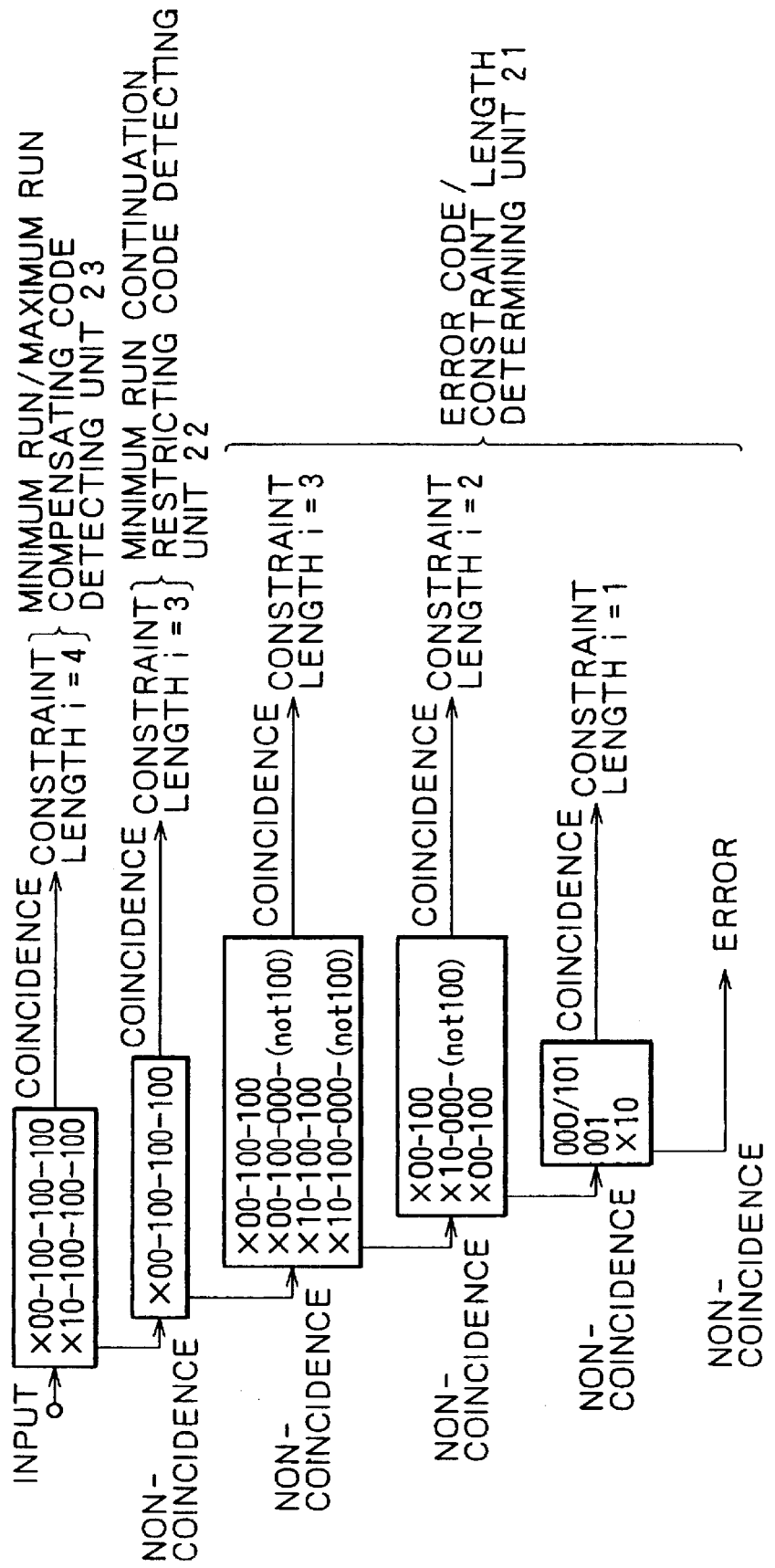

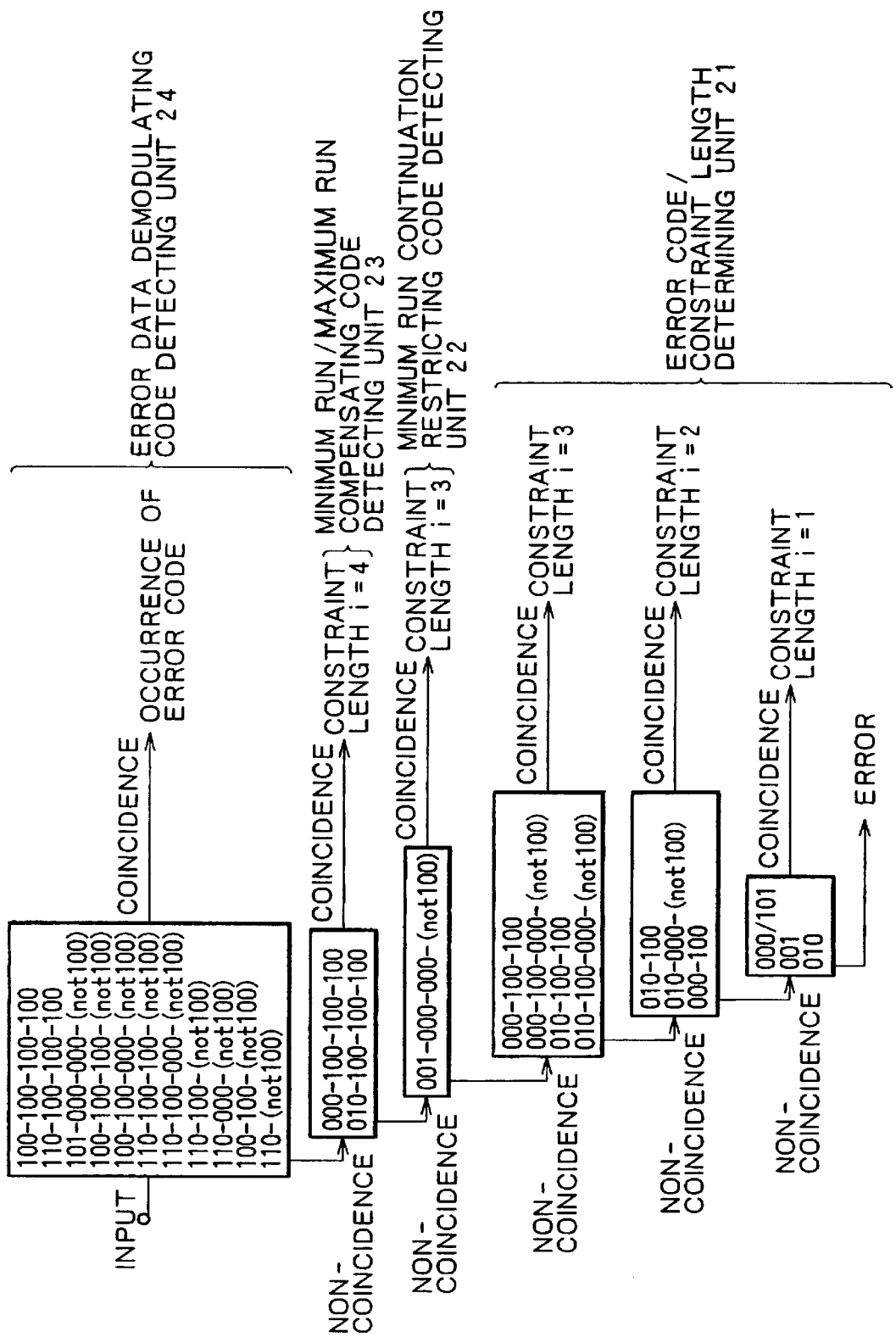

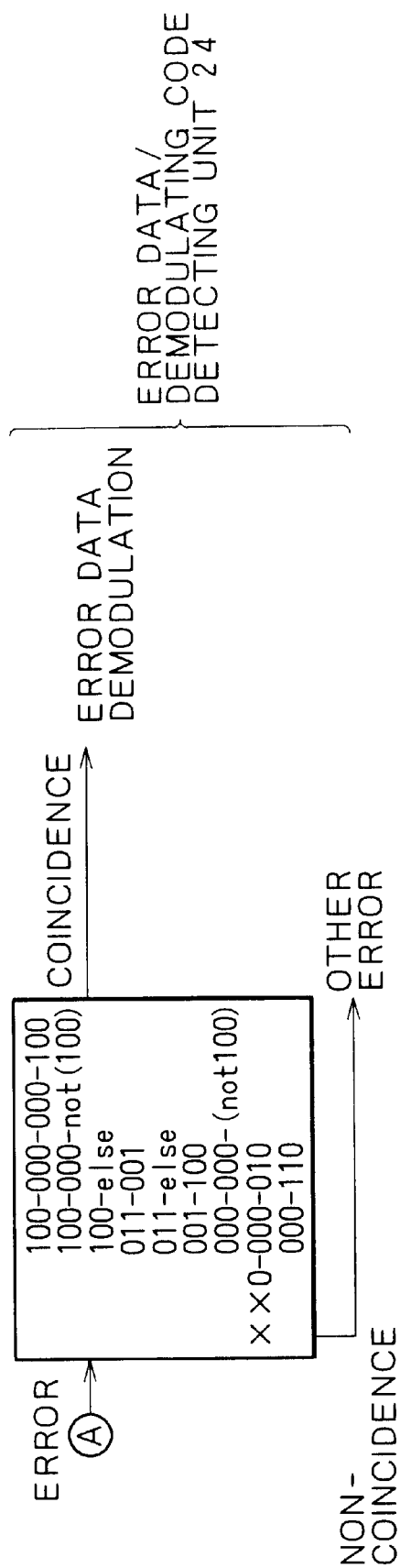

FIG.6

| CODE | DEMODULATION DATA | CONSTRAINT LENGTH |
|---|---|---|
| 100-000-000-100 | 00-10 | 2 |
| 100-000-(not100) | 00-00 | 2 |
| 100-(else) | 11 | 1 |
| | | |
| 011-001 | 01 | 1 |
| 011-(else) | 00 | 1 |
| | | |
| 001-100 | 00 | 1 |
| | | |
| 000-000-(not100) | 00-00 | 2 |
| 0-000-010 | 00 | 1 |
| 000-110 | 10 | 1 |

FIG. 7

| CODE (CONSTRAINT LENGTH=1, 2) | DEMODULATION DATA | CONSTRAINT LENGTH |
|---|---|---|
| 101 | 11 | 1 |
|  |  |  |
| 100-000-000-100 | 00-10 | 2 |
| 100-000-(not100) | 00-00 | 2 |
| 100-(else) | 11 | 1 |
|  |  |  |
| 011-001 | 01 | 1 |
| 011-(else) | 00 | 1 |
|  |  |  |
| ×10-100 | 0011 | 2 |
| ×10-000-(not100) | 0010 | 2 |
| ×10-(not000, 100) | 01 | 1 |
|  |  |  |
| 001-100 | 00 | 1 |
| 001-(else) | 10 | 1 |
|  |  |  |
| 000-000-(not100) | 00-00 | 2 |
| ×00-100 | 00-01 | 2 |
| 0-000-010 | 00 | 1 |
| 000-110 | 10 | 1 |
| 000-(else) | 11 | 1 |

DEMODULATING UNIT 13 & ERROR DATA
DEMODULATING UNIT 12

F I G. 11
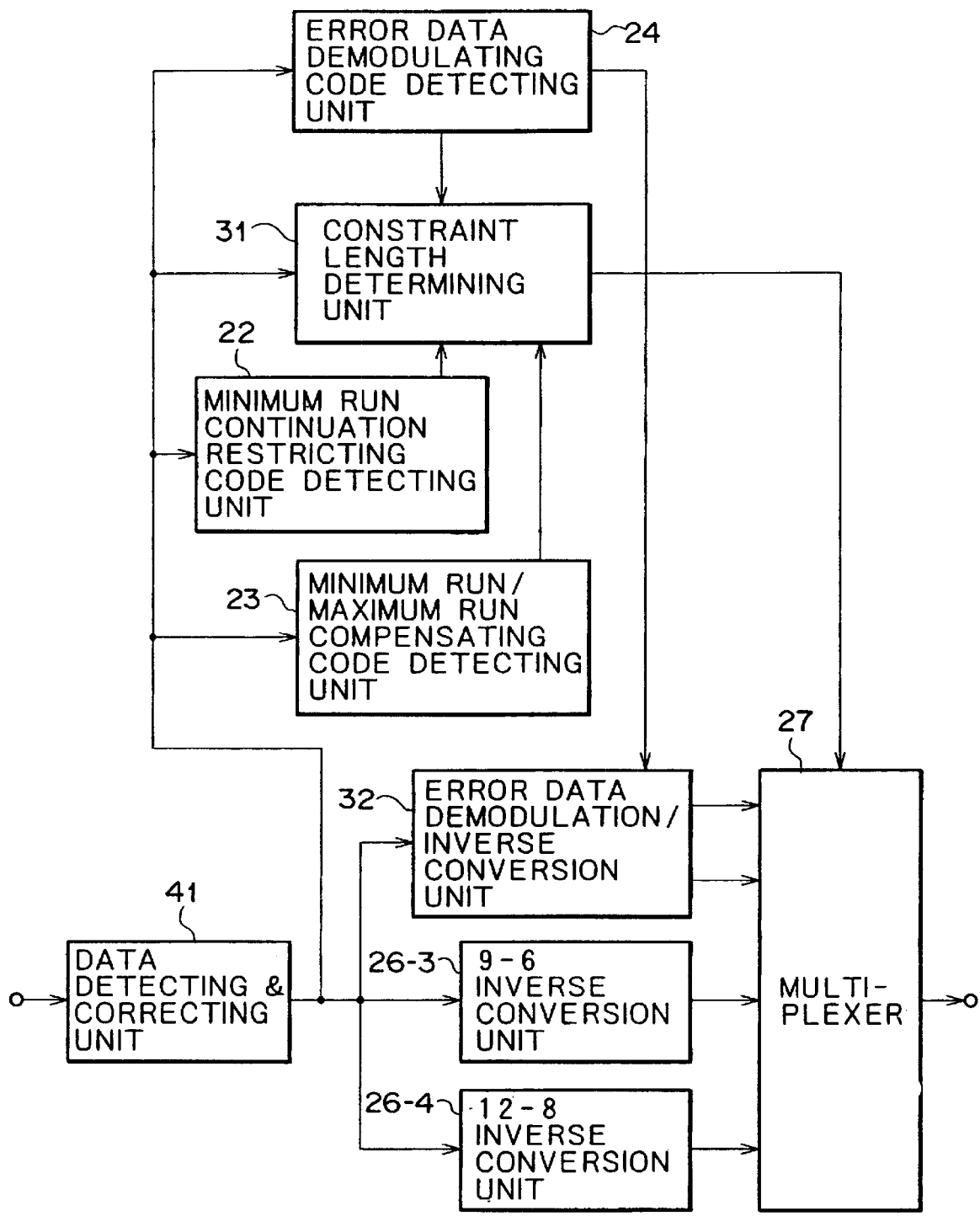
DATA DETECTING & CORRECTING UNIT 41, DEMODULATING
UNIT 13 & ERROR DATA DEMODULATING UNIT 12

DEMODULATING DEVICE, DEMODULATING METHOD AND SUPPLY MEDIUM WITH PREDETERMINED ERROR LENGTH

BACKGROUND OF THE INVENTION

1. Field of the Invention

The present invention relates to a demodulating device, a demodulating method and supply medium and more particularly to a demodulating device, a demodulating method and supply medium for reproducing data by demodulating data modulated suitably for data transmission or recording on a record medium.

2. Description of Related Art

When data is transmitted on a predetermined transmission path or recorded on a record medium such as a magnetic disk, an optical disk, a magneto-optic disc or the like, data is modulated to be suitable for transmission or recording. As one of such modulation methods, block coding is known. According to the block coding, a data string is blocked in a unit comprising m×i bits (hereinafter, simply referred to as data word) and the data word is converted into a data word comprising n×i bits in accordance with a pertinent code rule. Further, a code becomes a fixed length code when "i" is equal to 1 and becomes a variable length code when a plurality of "i"'s can be selected, that is, when the code is converted by selecting a predetermined one of "i" in a range of "i"'s of 1 through imax (maximum"i"). The block-coded code is represented as a variable length code (d,k;m,n;r).

In this case, "i" is referred to as a constraint length and imax is referred to as a maximum constraint length "r". Further, a minimum run "d" indicates a minimum number of consecutive "0"'s put between consecutive "1"'s in a code series and a maximum run "k" indicates a maximum number of consecutive "0"'s put between consecutive "1"'s in a code series.

In a compact disk, a mini disk or the like, there is carried out NRZI (Non Return to Zero Inverted) modulation in which the variable length code provided as described above is inverted with "1" and is not inverted with "0" and a variable length code which has been subjected to NRZI modulation (hereinafter, NRZI-modulated variable length code is referred to as level code) is recorded.

Further, when there is carried out inverse NRZI modulation in which the level code is set to "1" when the level code is inverted from "1" to "0" or from "0" to "1", that is, when the level code constitutes an edge, a code string the same as original EFM code or RLL (1-7) code can be provided. The inverse NRZI code string is referred to as edge code.

When a minimum inversion interval of the level code is designated by notation Tmin and a maximum inversion interval thereof is designated by notation Tmax, in order to carry out high density recording in a linear velocity direction, the longer the minimum inversion interval Tmin, that is, the larger the minimum run d, the better, further, in view of reproducing clocks, the shorter the maximum inversion interval Tmax, that is, the smaller the maximum run k, the more preferable and various modulation methods have been proposed.

Specifically, there is provided RLL (Run Length Limited Code) (2-7) as a modulation system used in, for example, a magnetic disk, a magnet-optical disk or the like. Parameters of the modulation system is (2,7;1,2;4). When a bit interval of the level code is designated by notation T, the minimum inversion interval Tmin calculated by (d+1)T becomes 3T from (2+1)T. When a bit interval of the data string is designated by notation Tdata, the minimum inversion interval Tmin becomes 1.5Tdata from (m/n)×Tmin=(½)×3. Further, the maximum inversion interval Tmax calculated by (k+1)T becomes 8(=7+1)T((=(m/n)×Tmax)Tdata=(½)×8Tdata=4.0Tdata). Further, a detection window width Tw calculated by (m/n)T becomes 0.5(=½)Tdata.

Otherwise, for example, there is RLL(1-7) as a modulation system used in recording of a magnetic disk, a magneto-optic disc or the like. Parameters of the modulation system are (1,7;2,3;2) and the minimum inversion interval Tmin becomes 2(=1+1)T(=⅔×2Tdata=1.33Tdata). Further, the maximum inversion interval Tmax becomes 8(=7+1)T(=⅔×8Tdata=5.33Tdata). Further, the detection window width Tw becomes 0.67(=⅔)Tdata.

When RLL(2-7) is compared with RLL(1-7), for example, in a magnetic disk system or a magnet-optical disk system, in order to increase a record density in the linear velocity direction, RLL(2-7) having the minimum inversion interval Tmin of 1.5Tdata is more preferably than RLL(1-7) having the minimum inversion interval Tmin of 1.33 Tdata. However, actually, RLL(1-7) having larger detection window width Tw and having a large allowance amount in respect of jitter is used more frequently than RLL(2-7).

The conversion table of RLL(1-7) code is, for example, a table shown by Table 1.

TABLE 1

RLL(1,7; 2,3; 2)

| Data | Code |
|---|---|
| i=1  11 | 00x |
|  10 | 010 |
|  01 | 10x |
| i=2  0011 | 000 00x |
|  0010 | 000 010 |
|  0001 | 100 00x |
|  0000 | 100 010 |

A symbol "x" in the conversion table is given "1" when a subsequent channel bit is "0" and given "0" when the subsequent channel bit is "1". The maximum constraint length "r" is 2.

Further, the conversion table of RLL(2-7) code having the minimum run "d" of 2 and the maximum inversion interval Tmax of 8T (maximum run 7) is, for example, a table shown by

TABLE 2

RLL(2,7; 1,2; 4)

| Data | Code |
|---|---|
| i=2  11 | 1000 |
|  10 | 0100 |
| i=3  011 | 001000 |
|  010 | 100100 |
|  000 | 000100 |
| i=4  0011 | 00001000 |
|  0010 | 00100100 |

The maximum constraint length "r" is 4.

Meanwhile, according to a channel bit string modulated by RLL(1-7), the occurrence frequency of 2T which is Tmin is the largest and followed by 3T and 4T. When much of edge information such as 2T or 3T is produced at early periods, it is preferable for reproducing clocks, however, when 2T's continue, a distortion is liable to cause in the record waveform (waveform output of 2T is small and susceptible to influence by defocusing or tangential tilt). Further, recording with high line density where minimum marks continue, is suspectible to influence of disturbance such as noise or the like and data reproduction error is liable to cause.

Hence, the applicant has proposed to restrict Tmin's from continuing by a predetermined number of times or more in Japanese Patent Application No. 9-133379 and the conversion table of the code is, for example, a table shown by Table 3.

TABLE 3

RML (1,7;2,3;3)

| Data | | Code |
|---|---|---|
| i=1 | 11 | 00x |
| | 10 | 010 |
| | 01 | 10x |
| i=2 | 0011 | 000 00x |
| | 0010 | 000 010 |
| | 0001 | 100 00x |
| | 0000 | 100 010 |
| i=3 | 100110 | 100 000 010 |

The symbol "x" in the conversion table is given "1" when a subsequent channel bit is "0" and is given "0" when the subsequent channel bit is "1". The maximum constraint length "r" is 3.

According to the conversion used in Table 3, in the case in which the data string becomes "10", when subsequent 4 data are referred and the total 6 data string becomes "100110", a code "100 000 010" for restricting repetition of the minimum run "d" is given. A number of the repetition of the minimum run "d" of the code provided by the conversion is 5 at maximum.

When the conversion using Table 3 is compared with RLL (1-7) of Table 1, although the minimum run "d", the maximum run "k", the basic data length "m" and the basic code length "n" remain the same, the constraint length "r" is increased from 2 to 3. This indicates that a maximum size of the table is increased and indicates that there is a possibility of increasing demodulation error propagation when, for example, bit shift error is caused in demodulation.

The bit shift error is an error in which "1" representing an edge in a code string is shifted forwardly or rearwardly by 1 bit. The error propagation is represented by, for example, a number of bits from start of error to finish of error of demodulation error which is caused when a code string in which an error is caused at one location thereof by the bit shift error is decoded as it is.

The bit shift error is a mode of error which is most frequently caused in reproducing data in an actual recording/reproducing device. Further, it has been confirmed that the error is caused mainly at a vicinity of the minimum run "d".

Further, when the variable length code (d,k;m,n;r), is, for example, a variable length (2,7;1,2;5), a conversion table in which the minimum run "d" of "0"'s is set to 2 bits, the maximum run "k" of "0"'s is set to 7 bits, the basic data length "m" is set to 1 bit, the basic code length "n" is set to 2 bits and the maximum constraint strength "r" is set to 5, is, for example, a conversion table shown by FIG. 4.

TABLE 4

RML (2,7;1,2;5)

| Data | | Code |
|---|---|---|
| i=2 | 11 | 1000 |
| | 10 | 0100 |
| i=3 | 011 | 001000 |
| | 010 | 100100 |
| | 000 | 000100 |
| i=4 | 0011 | 00001000 |
| | 0010 | 00100100 |
| i=5 | 01001 | 0000100100 |

The maximum constraint length "r" is 5.

According to the conversion using the conversion table shown by Table 4, in the case in which the data string becomes "010", when consecutive 2 data are referred and the total 5 data string becomes "01001", by giving a code "0000100100" for restricting repetition of the minimum run "d", a number of repetition of the minimum run "d" of a code provided by the conversion is 4 at maximum.

When the processing of Table4 is compared with RLL(2-7) of Table 2, although the minimum run "d", the maximum run "k", the basic data length "m" and the basic code length "n" remain the same, the maximum constraint length "r" is increased from 4 to 5. This indicates that the maximum size of table is increased and indicates that there is a possibility of increasing demodulation error propagation when a bit shift error is caused in, for example, demodulation.

As other run length restricting code, there are codes provided by, for example, conversion tables of Table 5 and Table 6 proposed by the applicant in Japanese Patent Application No. 10-150280. The code provided by the conversion tables of Table 5 and Table 6 is RLL(1, 7) code and is a modulation code restricting continuation of the minimum run "d" and given a rule to corresponding elements of data word and code word.

TABLE 5

(1,7;2,3;4)

| 11 | *0* |
|---|---|
| 10 | 001 |
| 01 | 010 |
| 0011 | 010 100 |
| 0010 | 010 000 |
| 0001 | 000 100 |
| 000011 | 000 100 100 |
| 000010 | 000 100 000 |
| 000001 | 010 100 100 |
| 000000 | 010 100 000 |
| "110111 | 001 000 000(next010) |
| 00001000 | 000 100 100 100 |
| 00000000 | 010 100 100 100 |

According to Table 5, the minimum run "d" is 1, the maximum run "k" is 7 and an element in the conversion table is provided with indeterminate codes. According to the indeterminate code, whether it is "0" or "1" is determined to protect the minimum run "d" and the maximum run "k" regardless of code word strings immediately therebefore and immediately thereafter. That is, in the processing utilizing the conversion table of FIG. 5, when 2 bits of a data string to be converted is (11), "000" or "101" is selected depending on a code word string immediately therebefore, when a 1 channel bit of a code word string immediately therebefore is "1", to protect the minimum run "d" (11) is converted into "000" and when a 1 channel bit of a code word string immediately therebefore is "0", (11) is converted into "101" to thereby protect the maximum run "d".

The conversion table of Table 5 is of a variable length structure. That is, conversion codes with the constraint length "i" of 1 are constituted by 3 of them which are fewer than a necessary number of four $(2^{(m \times i)}=2^{(2 \times 1)}=4)$ thereof. As a result, in converting a data string, there exists a data string which cannot be converted only with the constraint strength "i" of 1. As a result, according to Table 5, in order to deal with all of data strings, that is, in order to constitute a conversion table, the table up to the constraint strength "i" of 3 needs to refer to.

Further, the conversion table of Table 5 is provided with a substitution code for restricting continuation of minimum run in the conversion table. That is, when a data string is (110111), according to a processing using the conversion table of Table 5, a subsequent code word string is referred to and when the subsequent code word string is "010", the code is replaced by "001 000 000". When the subsequent code word string is other than "010", the table conversion is carried out as "*0*010*0*".

Thereby, according to a code word string after data conversion, continuation of the minimum run "d" is restricted and the minimum run "d" is repeated by 6 times at maximum.

Further, the conversion table of Table 5 is provided with a conversion rule in which surpluses of a number of "1"'s in elements of a data string divided by 2 and a number of "1"'s in elements of a converted code word string, are equally 1 or 0. For example, an element (000001) in a data string corresponds to a code word string of "010 100 100" and according to respective numbers "1"'s thereof, the number is 1 in the data string and 3 in the corresponding code word string and surpluses produced by dividing these by 2 are equally 1. Similarly, an element (000000) of a data string corresponds to "010 100 000" of a code word string and according to respective numbers "1" thereof, the number is 0 in the data string and the number is 2 in the corresponding code word string and surpluses produced by dividing these by 2 are equally 0.

Further, according to the conversion table of Table 5, the maximum constraint length "r" is 4. Conversion code having the constraint strength "i" of 4 is provided with the substitution code to realize the maximum run "k" of 7.

TABLE 6

(1,7;2,3;4)

| | | |
|---|---|---|
| i=1 Main table: | | |
| | 00 | 101 |
| | 01 | 100 |
| | 10 | 001 |
| | 11 | 000 |
| i=2 Substitution table A. (limits d to 1) | | |
| | 0000 | 100 010 |
| | 0001 | 101 010 |
| | 1000 | 000 010 |
| | 1001 | 001 010 |
| i=3 Substitution table B. (limits k to 8) | | |
| | 111111 | 000 010 010 |
| | 111110 | 001 010 010 |
| | 011110 | 101 010 010 |
| | 011111 | 100 010 010 |
| i=4 Substitution table C. (limits RMTR to 6) | | |
| | 00010001 | 100 010 010 010 |
| chan --0 | 10010001 | 100 000 010 010 |
| chan --1 | 10010001 | 000 010 010 010 |

TABLE 6-continued (1,7;2,3;4)

| | | |
|---|---|---|
| i=4 Substitution table D. (limits k to 7) | | |
| chan 010 | 11100000 | 000 001 010 010 |
| chan 010 | 11100010 | 100 001 010 010 |
| chan 010 | 11100001 | 001 010 010 010 |
| chan 010 | 11100011 | 101 010 010 010 |

The conversion table of Table 6 is of a structure having the minimum run "d" of 1, the maximum run "k" of 7 and 4 $(2^{(m \times i)}=2^{(2 \times 1)}=4)$ of conversion codes in the case of the constraint length "i" of 1. That is, the conversion table of Table 6 is of a structure in which a main table is constituted with the constraint strength "i" of 1 and by increasing the constraint length "i", the minimum run "d" and the maximum run "k" and the like are restricted. According to the conversion table of Table 6, a substitution code for restricting the minimum run "d" to 1 is provided with the constraint length "i" of 2, a substitution code for restricting the maximum run "k" to 8 is provided with the constraint length "i" of 3, further, a substitution code for restricting continuation of the minimum run "d" which is 1 is provided and a substitution code for restricting the maximum run "k" to 7 is provided with the constraint length "i" of 4. The maximum constraint length "i" is 4 in the conversion table of Table 6.

The conversion table of Table 6 is provided with the substitution code for restricting continuation of the minimum run "d" in the conversion table. That is, In a processing using the conversion table of Table 6, for example, a data string (00010001) is replaced by "100010010010" and in the case of a data string (10010001), a code word string immediately therebefore is referred to and the data string is replaced by selecting a conversion code depending on whether it is "0" or "1". According to the processing using the conversion table of Table 6, when a code word string immediately therebefore is "0". "100000010010" is selected when it is "1", "000010010010" is selected. Thereby, according to a code word string after data conversion, continuation of the minimum run "d" is restricted and the minimum run "d" is repeated by 6 times at maximum.

Further, the conversion table of Table 6 is provided with the conversion rule in which surpluses of a number of "1"'s in elements of a data string divided by 2 and a number of "1"'s in elements of a converted code word string divided by 2, are equally 1 or 0. For example, an element (1000) in a data string corresponds to a code word string of "000010" and according to respective numbers of "1" thereof, the number is 1 in the data string and the number is 1 in the corresponding code word string and surpluses of these divided by 2 are equally 1. Similarly, an element (111111) in a data string corresponds to a code word string of "000010010" and according to respective numbers of "1"'s thereof, the number is 6 in the data string and the number is 2 in the corresponding code word string and surpluses of these divided by 2 are equally 0.

Further, the conversion table of Table 6 is provided with substitution codes for realizing the maximum run "k" of 7 in conversion codes with the maximum constraint length "i" of 4. In this case, according to a processing using the conversion table of Table 6, in order to carry out the conversion, a code word string immediately therebefore is referred to and when it is "010", the substitution is executed.

Meanwhile, in recording on a record medium and transmission of data, coding modulation suitable for respective medium (transmission) is carried out. When direct current components are included in the modulation codes, a variation is liable to cause in various error signals such as a tracking error in servo control of a disk device or jitter is liable to cause. Therefore, it is preferable to include the direct current components as less as possible.

DSV (Digital Sum Value) signifies a total sum when a channel bit string is converted into NRZI (That is, level code) and "1" in the bit string (symbol of data) is set to +1 and "0" thereof is set to −1 and codes are added. DSV constitutes a measure of direct current components of a code string. By reducing an absolute value of DSV, that is, by carrying out DSV control, the direct current components of the code string are restrained.

In this case, in data conversion by conversion tables shown by Table 1 through Table 4, the data conversion per se cannot execute DSV control.

DSV control in such a case is realized by carrying out DSV calculation at predetermined intervals in a channel bit string after data conversion and inserting predetermined DSV control bits in the channel bit string.

Meanwhile, a channel bit string converted from a data string in accordance with Table 5 and Table 6 can be controlled similarly by DSV control at predetermined intervals and according to examples of Table 5 and Table 6, by utilizing a relationship between a data string and a converted code word string, the DSV control can be carried out further efficiently.

That is, when the conversion table is provided with the conversion rule in which surpluses of a number of "1"'s in elements of a data string divided by 2 and a number of "1"'s in elements of a converted code word string, are equally 1 or 0, insertion of a DSV control bit of "1" representing "inversion" or "0" representing "non-inversion", is equivalent to inserting a DSV control bit of "1" in a data bit string in the case of "inversion" and inserting a DSV control bit of "0" thereto in the case of "non-inversion".

For example, when in data conversion using the conversion table of Table 5, 3 bits for data conversion are consecutive as "001" and a DSV control bit is determined to insert thereafter, data conversion becomes (001−x) (x is 1 bit equal to 0 or 1). When "0" is given to x, the conversion table of Table 5 is as shown by Table 7.

TABLE 7

| Data | Code word |
|------|-----------|
| 0010 | 010 000   |

Further, when "1" is given to x, the conversion table of Table 5 is as shown by Table 8.

TABLE 8

| Data | Code word |
|------|-----------|
| 0011 | 010 100   |

When the code word string is converted into a level code by NRZI encoding, the conversion table of Table 7 and the con version table of Table 8 become as shown by Table 9.

TABLE 9

| Data | Code word | Level code |
|------|-----------|------------|
| 0010 | 010 000   | 011111     |
| 0011 | 010 100   | 01100      |

Final 3 bits in the level code string are mutually inverted. That is, by selecting "1" and "0" of the DSV control bits x, the DSV control can be executed even in the data string.

Considering a degree of redundancy in DSV control, execution of DSV control by 1 bit in a data string corresponds to execution of DSV control by 1.5 channel bit when expressed by a channel bit string since the basic data length "m" is 2 and the basic code length "n" is 3 in Table 5 and Table 6. In this case, for example, in order to execute DSV control in RLL(1-7) table as in Table 1, DSV control is executed in a channel bit string and to protect the minimum run "d", at least 2 channel bits are needed and the degree of redundancy is further increased.

According to conversion using the conversion tables of Table 5 and Table 6, DSV control can be executed in a data string and accordingly, the efficiency is excellent. According to codes converted by the conversion tables of Table 5 and Table 6, the DSV control can be executed and further, repetition of the minimum run "d" is restricted and therefore, they are codes suitable for high line density recording and reproducing.

Meanwhile, when codes converted by the conversion tables of Table 5 and Table 6 are compared with RML17 code of Table 3, although the minimum run "d", the maximum run "k", the basic data length "m" and the basic code length "n" stay the same, the maximum constraint length "r" becomes larger from 3 to 4. In other words, this indicates that the maximum size of the table becomes larger and indicates that when bit shift error is caused in, for example, demodulating, there is a possibility of increasing error propagation. Naturally, the smaller the error propagation, the better.

As described above, there poses a problem in which in the case where a record medium of a magnetic disk, a magneto-optical disc, an optical disk or the like is subjected to high density formation and RLL code having the minimum run "d" of 1 or more and having a large minimum mark length is selected as modulation code, when there is selected Table 5 or Table 6 for codes suitable for higher density recording and reproducing by restraining occurrence of error by reducing distortion in recording and reproducing and improving the efficiency of DSV control, in the case of a code having the large maximum constraint length "r", error propagation after error is caused is increased.

SUMMARY OF THE INVENTION

The present invention has been carried out in view of such a situation for reducing error propagation by a simpler constitution when bit shift error is caused.

According to an aspect of the present invention, there is provided a demodulating device for demodulating a code (d,k;m,n;r) having a minimum run of 1 or more and a basic code length of n bits and including a run length restriction code into data having a basic data length of m bits, the demodulating device comprising constraint length specifying means for specifying a constraint length of the code having a predetermined length including an error and demodulating means for demodulating the code based on the constraint length specified by the constraint length specifying means.

According to another aspect of the present invention, there is provided a demodulating method for demodulating a code (d,k;m,n;r) having a minimum run of 1 or more and a basic code length of n bits and including a run length restriction code into data having a basic data length of m bits, the demodulating method comprising a constraint length specifying step of specifying a constraint length of the code having a predetermined length including an error and a demodulating step of demodulating the code based on the constraint length specified at the constraint length specifying step.

According to another aspect of the present invention, there is provided a supply medium for supplying a demodulating device for demodulating a code (d,k;m,n;r) having a minimum run of 1 or more and a basic code length of m bits and including a run length restriction code into data having a basic data length of n bits, with a computer-readable program for executing a processing including a constraint length specifying step of specifying a constraint length of the code having a predetermined length including an error and a demodulating step of demodulating the code based on the constraint length specified at the constraint length specifying step.

According to another aspect of the present invention, there is provided a demodulating device for demodulating a code (d,k;m,n;r) having a minimum run of 1 or more and a basic code length of n bits and including a run length restriction code into data having a basic data length of m bits, the demodulating device comprising demodulating means for demodulating the code by using a demodulation table in correspondence with a code having a predetermined length including an error.

According to another aspect of the present invention, there is provided a demodulating method for demodulating a code (d,k;m,n;r) having a minimum run of 1 or more and a basic code length of n bits and including a run length restriction code into data having a basic data length of m bits, the demodulating method comprising a demodulating step of demodulating the code by using a demodulation table in correspondence with a code having a predetermined length including an error.

According to another aspect of the present invention, there is provided a supply medium for supplying a demodulating device for demodulating a code (d,k;m,n;r) having a minimum run of 1 or more and a basic code length of m bits and including a run length restriction code into data having a basic data length of n bits, with a computer-readable program for executing a processing including a demodulating step of demodulating the code by using a demodulation table in correspondence with a code having a predetermined length including an error.

According to the demodulating device, the demodulating method and the supply medium of the above-described aspects of the invention, the constraint length of the code having the predetermined length including the error is specified and the code is demodulated based on the specified constraint length.

According to the demodulating device, the demodulating method and the supply medium of the above-described aspects of the invention, the code is demodulated by using the demodulation table in correspondence with the code having the predetermined length including the error.

BRIEF DESCRIPTION OF THE DRAWINGS

FIG. 3 is a diagram for explaining processes of an error code/constraint length determining unit 21, a minimum run continuation restricting code detecting unit 22, a minimum run/maximum run compensating code detecting unit 23 and an error data demodulating code detecting unit 24;

FIG. 4 is a diagram for explaining the processing of the error code/constraint length determining unit 21, the minimum run continuation restricting code detecting unit 22, the minimum run/maximum run compensating code detecting unit 23 and the error data demodulating code detecting unit 24;

FIG. 6 is a diagram for explaining details of operation of the error data demodulating code detecting unit 24;

FIG. 7 is a diagram for explaining other operation of the error data demodulating code detecting unit 24;

FIG. 11 is a block diagram showing detailed constitutions of a data detecting and correcting unit 41, the demodulating unit 13 and the error data demodulating unit 12.

DETAILED DESCRIPTION OF THE PREFERRED EMBODIMENTS

An explanation will be given of embodiments according to the present invention as follows. A description will be given of characteristics of the present invention by adding a corresponding embodiment (one example) in a parenthesis after each means to clarify a corresponding relationship between each means of the present invention specified in the scope of claims and the embodiment as follows. However, naturally, the description does not signify that the present invention is limited to the described respective means.

Figure 2:
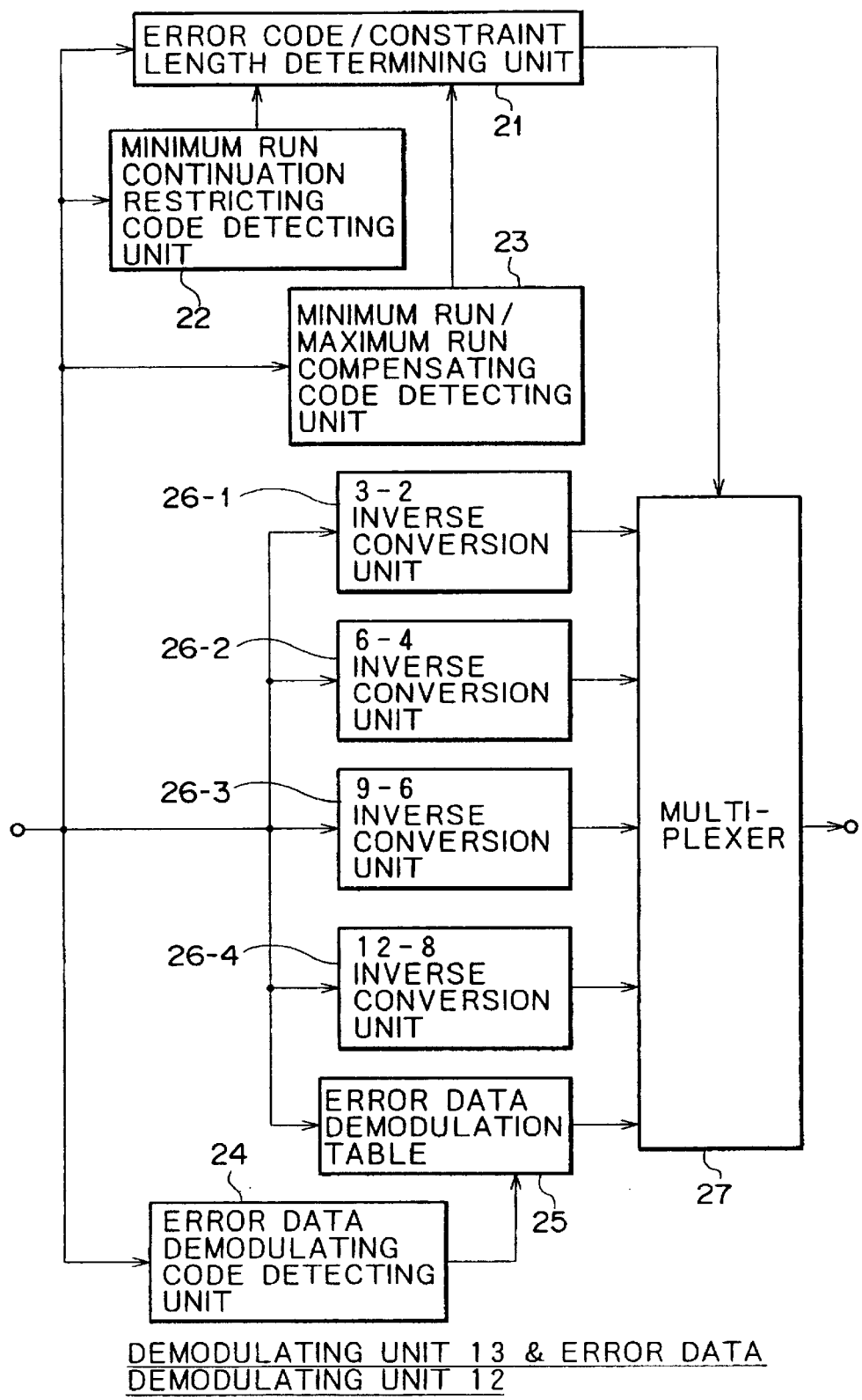
FIG. 2 is a block diagram showing detailed constitutions of a demodulating unit 13 and an error data demodulating unit 12.

That is, a demodulating device specified in claim 1 is characterized in including constraint length specifying means for specifying a constraint length of a code having a predetermined length including an error (for example, error code/constraint length determining unit 21, minimum run continuation restricting code detecting unit 22 and minimum run/maximum run compensating code detecting unit 23 in FIG. 2) and demodulating means for demodulating a code based on the constraint length specified by the constraint length specifying means (for example, inverse conversion units 26-1 through 26-4 and the error data demodulation table 25 in FIG. 2).

Figure 9:
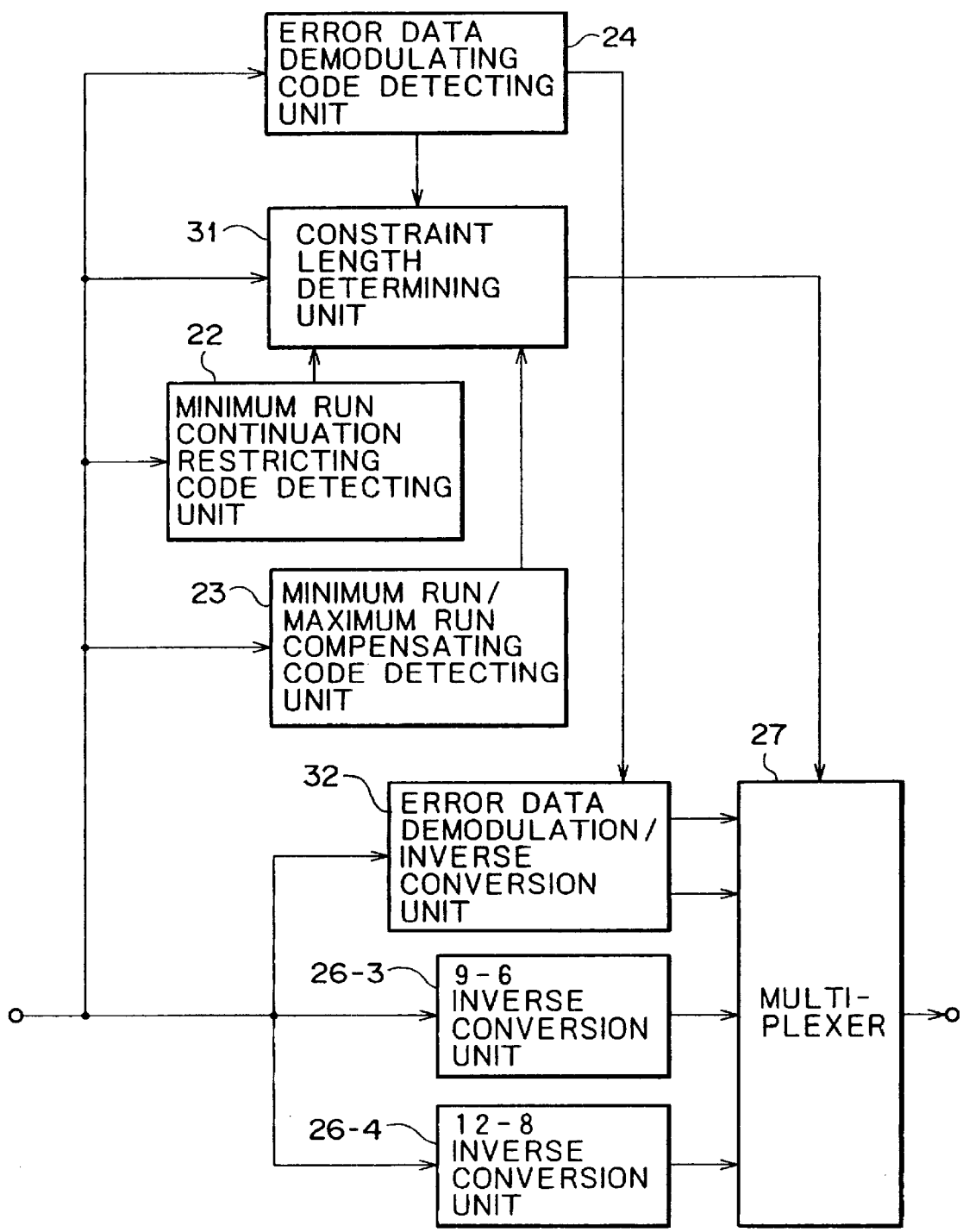
FIG. 9 is a block diagram showing other detailed constitutions of the demodulating unit 13 and the error data demodulating unit 12.

A demodulating device specified by claim 7 is characterized in including demodulating means for demodulating a code by using a demodulation table in correspondence with a code having a predetermined length including an error (for example, error data demodulation/inverse conversion unit of FIG. 9).

An explanation will be given of an embodiment of a demodulating device according to the present invention in reference to the drawings as follows. This embodiment is applied to a demodulating device for demodulating a modulated code word string in which a data string is converted into a variable length code (d,k;m,n)=(1,7;2,3) by using the conversion tables shown by Table 5 and Table 6.

Figure 1:
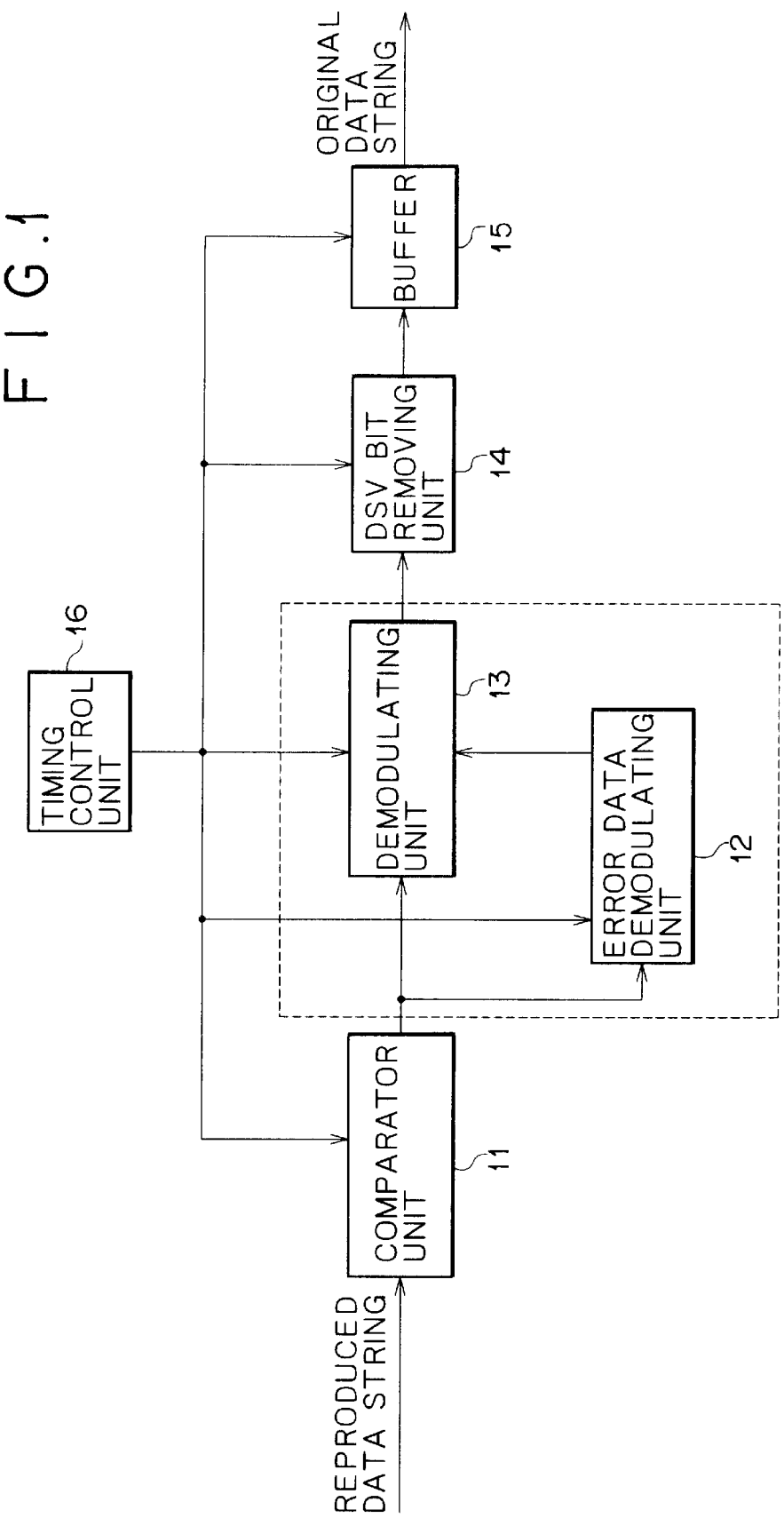
FIG. 1 is a block diagram showing a constitution of an embodiment of a demodulating device.

FIG. 1 is a block diagram showing a constitution of an embodiment of a demodulating device using a demodulation table in correspondence with the table of Table 5. As shown by FIG. 1, a comparator unit 11 of the demodulating device binarizes a signal transmitted from a transmission path or a signal reproduced from a record medium. The comparator unit 11 removes portions not related to data such as a synchronizing signal or the like inserted after having been demodulated into a channel bit string.

An error data demodulating unit 12 forms a demodulation table for carrying out further probable demodulation from binarized data although not present in the demodulation table and carries out demodulation based thereon.

A demodulating unit 13 carries out demodulation based on the demodulation table. When data supplied from the comparator unit 11 coincides with the demodulation table provided to the demodulating unit 13, the demodulating unit 13 demodulates supplied data and outputs it. Further, when data supplied from the comparator unit 11 does not coincide with the demodulation table provided to the demodulating unit 13, that is, in the case of error, the error data demodulating unit 12 outputs a demodulation result.

When Table 5 is used, there can be used a DSV control method in which a data string is converted into a code word string after inserting 1 bit of a DSV control bit and therefore, a DSV bit removing unit 14 removes DSV control bits in the data string inserted at arbitrary intervals from data supplied from the demodulating unit 13 and outputs an original data string.

Further, a buffer 15 temporarily stores serial data supplied from the DSV bit removing unit 14, reads it at a predetermined transmission rate and outputs it. A timing control unit 16 forms a timing signal and supplies it to the comparator unit 11, the error data demodulating unit 12, the demodulating unit 13, the DSV bit removing unit 14 and the buffer 15 to thereby control timing.

FIG. 2 is a block diagram showing detailed constitutions of the demodulating unit 13 and the error data demodulating unit 12. The comparator unit 11 in the demodulating device of FIG. 1 converts a digital data string (level codes) modulated by NRZI modulation into inverse NRZI codes (edge codes). An error code/constraint length determining unit 21 receives input of binarized digital signals, determines a constraint length "i", outputs the constraint length "i" when the digital data string is present in the demodulation table of Table 5 and outputs signals which refer to an error data demodulation table 25 when the digital data string is not present in the conversion table of Table 5, that is, in the case of the digital data string of error.

A minimum run continuation restricting code detecting unit 22 detects an exclusive code provided for restricting continuation of the minimum run "d" from input of the binarized digital signals and supplies the information to the constraint length determining unit 21. A minimum run/maximum run compensating code detecting unit 23 detects an exclusive code provided for compensating the minimum run "d" and the maximum run "k" from input of the binarized digital signals and supplies the information to the constraint length determining unit 21.

An error data demodulating code detecting unit 24 detects a predetermined demodulating code which is not present in the demodulation table of Table 5 from input of the binarized digital signals and supplies the information to the error data demodulation table 25 when the predetermined demodulating code is present.

The error data demodulation table 25 is provided with a structure similar to those of inverse conversion units 26-1 through 26-4 and selects and determines which error data demodulation table is used based on the information of the error data demodulating code detecting unit 24.

The inverse conversion units 26-1 through 26-4 are provided with tables for demodulating a variable length code of n×i bits into data of m×i bits. A multiplexer 27 switches and selects data from the inverse conversion units 26-1 through 26-4 and error data from the error data demodulation table 25 and outputs it as serial data.

At this occasion, an explanation will be given of demodulation of error data. In Table 5, two elements with the constraint length i=4 are not mistaken for other even when they are demodulated by disregarding front code words. That is, in the cases of code word strings of "000-100-100-100" (first term) and "100-100-100-100" (second term) as well as "010-100-100-100" (first term) and "110-100-100-100" (second term), although the first terms of the respective code word string are present in Table 5, the second terms are not present in Table 5 and are errors. However, even when the second terms are regarded as equal to the first terms, "X00-100-100-100" is demodulated as (00001000) and "X10-100-100-100" is demodulated as (00000000) ("X" is an arbitrary code word), correct demodulation can be carried out when there is no error in the code word and when there is an error in the code word, a demodulation result having less error can be selected.

Similarly, even in the case where the constraint length "i" is 3 or 2 other than 4, in all of elements front code words may be disregarded and even in such a case, correct demodulation is carried out when there is no error in the code word and when there is error in the code word, a demodulation result having less error can be selected.

Further, in the case where the constraint length "i" is 1, among three elements, front code words may be disregarded only in "010" and "110" and "X10" may be written as (01).

When the demodulation table of Table 5 is formed based on the above-described, the demodulation table can be expressed as in Table 10 shown below and processes of the error code/constraint length determining unit 21, the minimum run continuation restricting code detecting unit 22, the minimum run/maximum run compensating code detecting unit 23 and the error data demodulating code detecting unit 24 can be expressed as shown by FIG. 3.

The minimum run/maximum run compensating code detecting unit 23 outputs a signal indicating that the constraint length "i" is 4 to the error code/constraint length determining unit 21 when an inputted code word string is determined to be "X00-100-100-100" or "X10-100-100-100" and outputs a signal indicating that the constraint length "i" is other than 4 to the error code/constraint length determining unit 21 when an inputted code word string is determined not to be "X00-100-100-100" or "X10-100-100-100" The minimum run continuation restricting code detecting unit 22 outputs a signal indicating that the constraint strength "i" is 3 to the error code/constraint length determining unit 21 when an inputted code word string is determined to be "X01-000-000-(not 100)" and outputs a signal indicating that the constraint strength "i" is not determined to be 3 to the error code/constraint length determining unit 21 when an inputted code word string is determined not to be "X01-000-000-(not 100)".

The error code/constraint length determining unit 21 outputs a signal indicating that the constraint length "i" is 3 when an inputted code word string is determined to be "X00-100-100", "X00-100-000-(not 100)", or "X10-100-000-(not 100)" and determines whether the inputted code word string is "X10-100", "X10-000-(not 100)" or "X00-100" when the inputted code word string is determined not to be "X00-100-100", "X00-100-000-(not 100)", "X10-100-100" or "X10-100-000-(not 100)". The error code/constraint length determining unit 21 outputs a signal indicating that the constraint strength "i" is 2 when the inputted code word string is "X10-100", "X1 0-000-(not 100)" or "X00-100" and determines whether the inputted code word string is "000", "101", "001" or "X10" when the inputted code word string is determined not to be "X10-100", "X10-000-(not 100)" or "X00-100". The error code/constraint length determining unit 21 outputs a signal indicating that the constraint length "i" is 1 when the inputted code word string is "000", "101", "001" or "X10" and outputs an error when the inputted code word string is determined not to be "000", "101", "001" or "X10".

TABLE 10

Demodulation table (1,7;2,3;4)

| code | demodulated data |
|---|---|
| i=1  101 | 11 |
| 000 | 11 |
| 001 | 10 |
| x10 | 01 |
| i=2  x10 100 | 0011 |
| x10 000(not 100) | 0010 |
| x00 100 | 0001 |
| i=3  x00 100 100 | 000011 |
| x00 100 000(not 100) | 000010 |
| x10 100 100 | 000001 |
| x10 100 000(not 100) | 000000 |
| i=3 : Prohibit Repeated Minimum Transition Runlength | |
| x01 000 000(not 100)   110111 | |
| i=4 : limits k to 7 | |
| x01 100 100 100   00001000 | |
| x10 100 100 100   00000000 | |
| (x: 0 or 1) | |

In complying with Table 10, mentioned above, by providing Table 10 to the inverse conversion units 26-1 through 26-4 of FIG. 2 and providing Table 10 also to the error code/constraint length determining unit 21, substantially, the error data demodulation table 25 and the error data demodulating code detecting unit unit 24 shown by FIG. 2 are not needed. That is, in FIG. 1, there can be constructed a constitution in which the demodulating unit 13 and the error data demodulating unit 12 are united in one unit.

Meanwhile, a conventional demodulation table in correspondence with Table 5 where demodulation including error is not carried out is as indicated in Table 11, shown below.

TABLE 11

Demodulation table (1,7;2,3;4)

| code | demodulated data |
|---|---|
| i=1  101 | 11 |
| 000 | 11 |
| 001 | 10 |
| x10 | 01 |

TABLE 11-continued

Demodulation table (1,7;2,3;4)

| code | demodulated data |
|---|---|
| i=2  x10 100 | 0011 |
| x10 000(not 100) | 0010 |
| x00 100 | 0001 |
| i=3  000 100 100000011 | |
| 000 100 000(not 100) | 000010 |
| 010 100 100 | 000001 |
| 010 100 000(not 100) | 000000 |
| i=3 : Prohibit Repeated Minimum Transition Runlength | |
| 001 000 000(not 100)   110111 | |
| i=4 : limits k to 7 | |
| 001 100 100 100   00001000 | |
| 010 100 100 100   00000000 | |

In the case of complying with Table 11 showing conventional processing, Table 11 is provided to the inverse conversion units 26-1 through 26-4 of FIG. 2 and Table 11 is also provided to the error code/constraint length determining unit 21. Then, the error data demodulation table 25 and the error data demodulating code detecting unit 24 in FIG. 2 are needed.

FIG. 4 shows a diagram in which the demodulating unit 13 and the error data demodulating unit 12 are installed to differentiate from each other and details of processes shown by FIG. 3 are rewritten in correspondence with FIG. 2 based on Table 11. FIG. 4 corresponds to operations of the respective units of FIG. 2.

When the error data demodulating code detecting unit 24 determines that an inputted code word string is:
"100-100-100-100",
"110-100-100-100",
"101-000-000-(not 100)",
"100-100-100-(not 100)",
"100-100-000-(not 100)",
"110-100-100-(not 100)",
"110-100-000-(not 100)",
"110-100-(not 100)",
"110-000-(not 100)",
"100-100-(not 100)",
or,
"110-(not 100)",
the error data demodulating code detecting unit 24 transmits a predetermined signal such that respectively corresponding demodulation data are outputted in the error data demodulation table 25.

In the case other than the above-described, an error which cannot be demodulated is constituted and the error data demodulation table 25 outputs a predetermined value for the error.

Further, an output from the error data demodulation table 25 to the multiplexer 27 is used when an output as an error code is provided from the error code/constraint length determining unit 21 is provided to the multiplexer.

The minimum run/maximum run compensating code detecting unit 23 outputs a signal indicating that the constraint length "i" is 4 to the error code/constraint length determining unit 21 when the inputted code word string is determined to be "000-100-100-100" or "010-100-100-100" and outputs a signal indicating that the constraint length "i" is other than 4 to the error code /constraint length determining unit 21 when the inputted code word string is determined not to be "000-100-100-100" or "010-100-100-100". The minimum run continuation restricting code detecting unit 22 outputs a signal indicating that the constraint length "i" is 3 to the error code/constraint length determining unit 21 when the inputted code word string is "001-000-000-(not 100)", and outputs a signal indicating that the constraint length "i" is determined not to be 3 to the error code/constraint length determining unit 21 when the inputted code word string is determined not to be "001-000-000-(not 100)".

The error code/constraint length determining unit 21 outputs a signal indicating that the constraint length "i" is 3 when the inputted code word string is determined to be "000-100-100", "000-100-000-(not 100)", "010-100-100" or "010-100-000-(not 100)" and determines whether the inputted code word string is "010-100", "010-000-(not 100)" or "000-100" when the inputted code word string is determined not to be "000-100-100", "000-100-000-(not 100)", "010- 100-100" or "010-100-000-(not 100)". The error code/constraint length determining unit 21 outputs a signal indicating that the constraint length "i" is 2 when the inputted code word string is "010-100", "010-000-(not 100) ", or "000-100" and determines whether the inputted code word string is "000", "101", "001" or "010" when the inputted code word string is determined not to be "010-100", "010-000-(not 100)" or "000-100". The error code/ constraint length determining unit 21 outputs a signal indicating that the constraint length "i" is 1 when the inputted code word string is determined to be "000", "101", "001" or "010" and outputs an error when the inputted code word string is determined not to be "000", "101", "001" or "010".

FIG. 3 and FIG. 4 show the specific method of reducing the first shift error according to the invention. In this way, the method of reducing demodulation error propagation in causing the first shift error according to the invention is shown.

Next, an explanation will be given of a method of reducing modulation error propagation when second shift error is caused according to the invention. The first and the second shift error reducing methods are independent from each other and either of them may be constituted. In this case, a description will be given of an example including both of the first and the second shift error reducing methods.

Figure 5A:
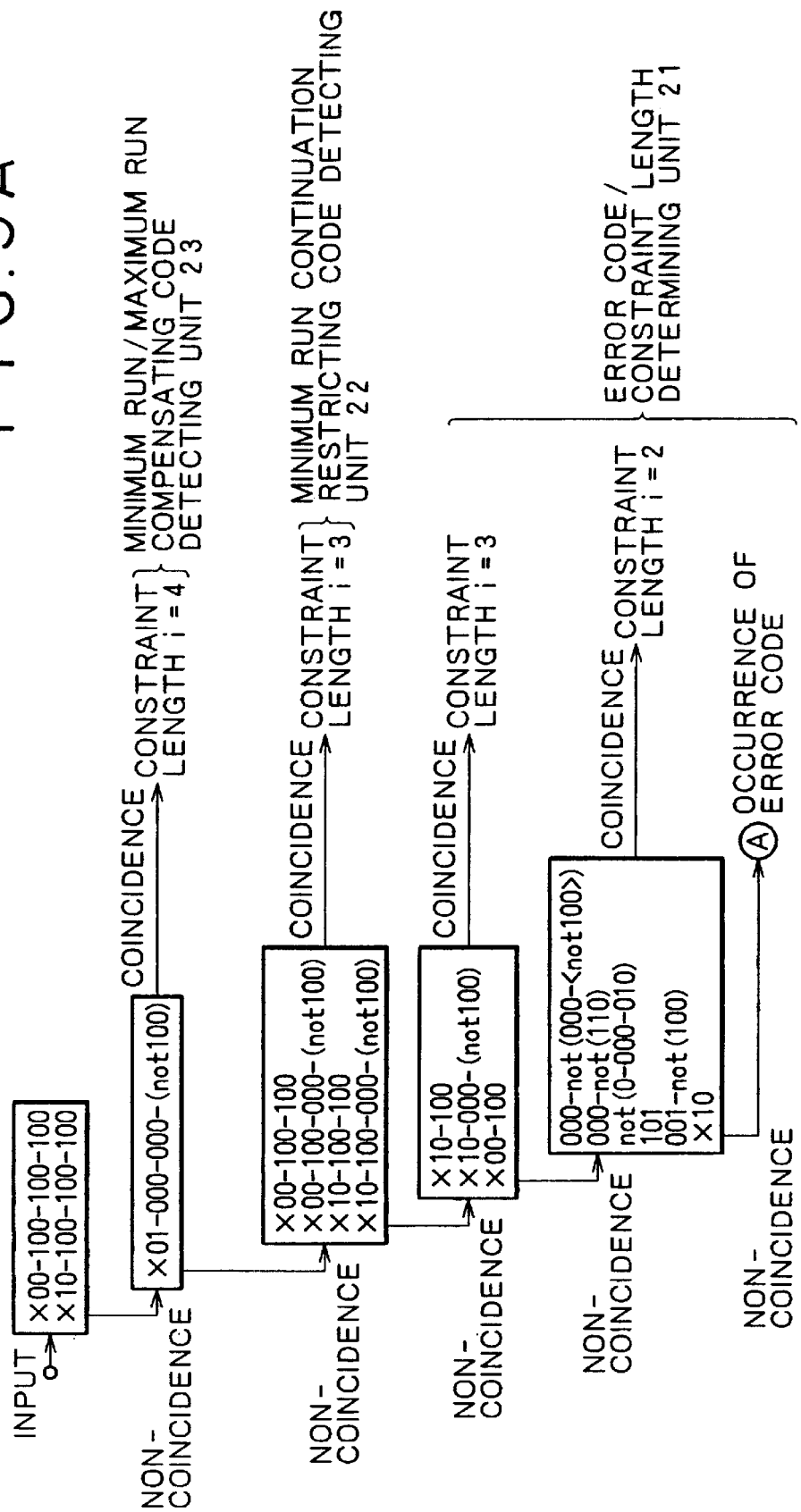
FIG. 5 is a diagram for explaining the processing of the error code/constraint length determining unit 21, the minimum run continuation restricting code detecting unit 22, the minimum run/maximum run compensating code detecting unit 23 and the error data demodulating code detecting unit.
Figure 8:
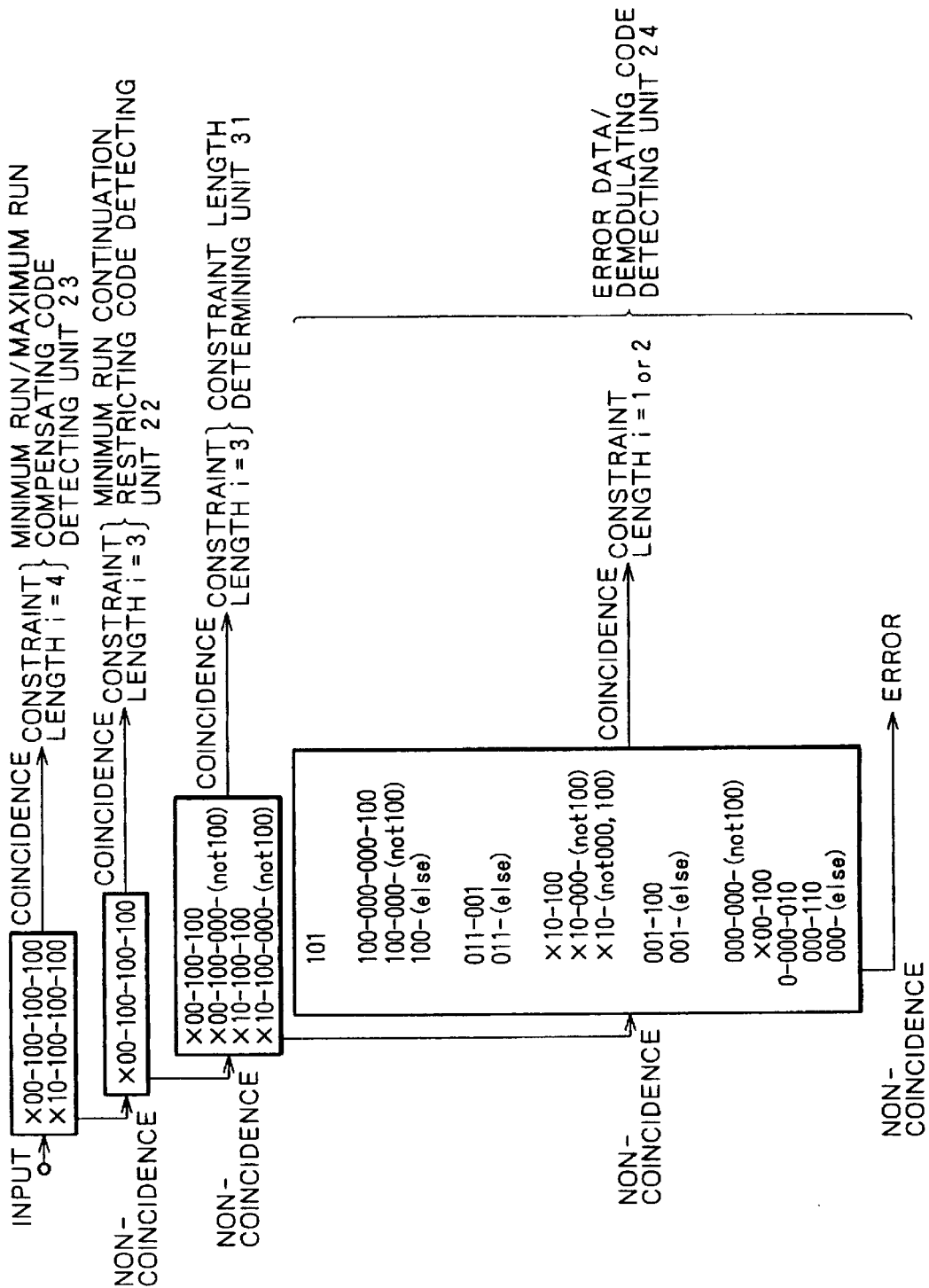
FIG. 8 is a diagram for explaining processes of a constraint length determining unit 31, the minimum run continuation restricting code detecting unit 22, the minimum run/maximum run compensating code detecting unit 23 and the error data demodulating code detecting unit 24.

FIG. 5 and FIG. 8 specifically shows the method of reducing the second shift error in addition to the method of reducing the first shift error according to the invention.

Processes of FIG. 5 expand the method of demodulating error data, explaining processes of the constraint length determining unit 21, the minimum run continuation restricting code detecting unit 22, the minimum run/maximum run compensating code detecting unit 23 and the error data demodulating code detecting unit 24 in which in Table 5, even when error is caused, demodulation is carried out further correctly and error propagation is reduced and when there causes no error, demodulation is carried out without fail.

Processes shown by FIG. 5 are the same as processes of FIG. 3 when the constraint length "i" is 2, 3 or 4, however, determination of error is made severer when the constraint length "i" is 1. That is, the error code/constraint length determining unit 21 outputs a signal indicating that the constraint length "i" is 1 when the inputted code word string is determined to be "000-not(000) -<not 100>)", "000-not (110)", "not (0-000-010)", "101", "001-not 100" or "X10" and outputs an error when the inputted code word string is determined not to be "000-not(000)-<not 100>)", "000-not (110)", "not (0-000-010)", "101", "001-not 100" or "X10". However, when there causes no error in demodulation, the processes shown by FIG. 3 and the processes shown by FIG. 5 output the same result (demodulation result). Further, the processes shown by FIG. 5 determine the case in which the constraint length "i" does not coincide even with 1 and the coincidence is carried out in the error data demodulation table 25.

FIG. 6 shows a diagram for explaining details of processes of the error data demodulating code detecting unit 24 and the error data demodulation table 25 shown by FIG. 5. That is, all of codes shown on the left side of FIG. 6 constitute error in the processing using the demodulation table of FIG. 5 and therefore, the codes are demodulated to data shown on the right side of FIG. 6. According to the codes, a 12 code word at maximum is referred to (a case of a first code from top of FIG. 6), further, a 1 code word immediately before a code word to be converted is referred to (a case of a second code from bottom of FIG. 6). Further, modulated data words are 2 data words or 4 data words (respectively, the constraint length "i" corresponds to 1 or 2). In this case, referred code and demodulating data are different from a relationship of conversion rate (m, n)=(2, 3) of FIG. 5. However, a code word which is transmitted (in which bits are made to advance) after determining a modulation is only demodulation data×(n/m) based on the demodulation data.

Even when the error data demodulation table 25 for executing the processes shown by FIG. 6 is partially omitted, for example, for simplifying hardware, demodulation per se of data is correctly carried out For example, in respect of the error data demodulation table 25, a portion referring to a 12 code word disposed first from top of FIG. 6 may be omitted and referred portions may be reduced to 9 code words at maximum (second from top and third from bottom).

FIG. 7 is a diagram describing other operation of the error data demodulating code detecting unit 24 and the error data demodulation table 25, corresponds to a diagram rewritten from FIG. 5 and FIG. 6 and is a diagram for explaining independent processes of a demodulating unit having the constraint length "i" of 2 or smaller. According to the example shown by FIG. 7, when the constraint length "i" is 1 or the constraint length "i" is 2, demodulation of correct data and demodulation of error data are processed in the same table. According to the example of FIG. 7, correct demodulation such that a 3 code word "101" is converted to data (11) is also carried out and demodulation of error data such that a code word "100-010" is converted into data (11) is also carried out. By constituting as shown by FIG. 7, portions of the error data demodulating unit 12 in correspondence with the constraint length "i" of 1 or the constraint length "i" of 2 are efficiently constituted.

FIG. 8 is a diagram describing other operations of the constraint length determining unit 21, the minimum run continuation restricting code detecting unit 22, the minimum run/maximum run compensating code detecting unit 23 and the error data demodulating code detecting unit 24 in the case of executing operation shown by FIG. 7. FIG. 8 corresponds to a diagram of rewriting and simplifying FIG. 5. FIG. 8 shows the processes of the demodulating unit 13 and the error data demodulating unit 12 when the error data demodulating unit 12 is provided with a constitution of FIG. 7 and FIG. 9 shows constitutions of the demodulating unit 13 and the error demodulating unit 12 at the occasion. FIG. 5 and FIG. 8 show the same demodulation content and FIG. 6 and FIG. 7 show specific examples of the processing of the error data demodulating unit 12.

Also in FIG. 9, a digital data string in which a signal supplied from a transmission path or a signal reproduced by a record medium is binarized, is converted into an inverse NRZI code (edge code) and is inputted when it is demodulated by NRZI modulation (when it is level code). A constraint length determining unit 31 receives input of the binarized digital signal and determines the constraint length "i". In the cases of the constraint length i=3 and the constraint length i=4, the constraint length determining unit 31 determines the constraint length by omitting respective front 1 bit of referred data and determines the constraint length "i" in the cases of the constraint length i=2 and the constraint length i=1 regardless of whether the signal is present or not present in Table 11 which is the demodulation table of Table 5.

The error data demodulating code detecting unit 24 outputs the determination result to the constraint length determining unit 31 and an error data demodulation/inverse conversion unit 32 with the constraint length "i" of 1 or 2 including an error data demodulation table having a specific demodulation table. Although the constraint length determining unit 31 determines whether the constraint length "i" is 1 or 2 by using information supplied from the error data demodulating code detecting unit 24, the constraint length determining unit 31 does not particularly need information from the error data demodulating code detecting unit 24 in determining whether the constraint length "i" is 3 or 4. The determination result of the constraint length determining unit 31 is supplied to the multiplexer 27.

Further, the minimum run continuation restricting code detecting unit 22 detects an exclusive code provided for restricting continuation of the minimum run "d" from input of a binarized digital signal and supplies the information to the constraint length determining unit 31. Further, the minimum run/maximum run compensating code detecting unit 23 detects an exclusive code provided for compensating the minimum run "d" and the maximum run "k" from input of the binarized digital signal and transmits the information to the constraint length determining unit 31.

The error demodulation/inverse conversion unit 32 is provided with a table of inversely converting a code word of n×i bits into data of m×i bits. The inverse conversion units 24-3 and 26-4 are provided with a table for demodulating a variable length code of n×i bits to data of m×i bits. The multiplexer 27 selects any of outputs from the inverse conversion units 24-3 and 26-4 and the error data demodulation/inverse conversion unit 32 based on information supplied from the constraint length determining unit 31 and outputs it as serial data.

Next, an explanation will be given of operation of the demodulating unit 13 and the error data demodulating unit 12 shown by FIG. 9.

A signal transmitted from a transmission path or a signal reproduced from a record medium is subjected to a processing of waveform equalization or the like, inputted to the comparator unit 11 of FIG. 1 and subjected to comparison operation.

The comparator unit 11 converts the signal into a digital signal of inverse NRZI code (code in which "1" indicates edge) and inputs it to the constraint length determining unit 31. A processing of determining the constraint length is executed there and the determination result (constraint length) is outputted to the multiplexer 27. The constraint length determining unit 31 is provided with an inverse conversion table (demodulation table) in correspondence with Table 5, for example, as shown by FIG. 7.

The digital signal output from the comparator unit 11 is also inputted to the minimum run continuation restricting data detecting unit 22 in which an exclusive pattern provided for restricting continuation of the minimum run "d" is detected and the detection result is outputted to the constraint length determining unit 31. The minimum run continuation restricting data detecting unit 22 includes a substitution code for restricting continuation of the minimum run "d" in the conversion table (in the case of Table 5, "x01 000 000" including a portion of converting a code word "001 000 000" and "101 000 000") and detects a code restricting continuation of the minimum run "d" by referring to the demodulation table and outputs a predetermined detection signal to the constraint length determining unit 31.

Further, the digital signal output from the comparator unit 11 is also inputted to the minimum run/maximum run compensating code detecting unit 23 in which an exclusive pattern provided for compensating the minimum run "d" and the maximum run "k" is detected and the detection result is outputted to the constraint length determining unit 31. The minimum run/maximum run compensating code detecting unit 23 includes a substitution code for protecting the maximum run "k" in the conversion table shown by Table 5 (in the case of Table 5, a code word string "x00 100 100 100" or "x10 100 100 100" and detects the substitution code for protecting the maximum run "k" by referring to the demodulation table and outputs a predetermined detection signal to the constraint length determining unit 31.

Further, the digital signal output from the comparator unit 11 is also inputted to the error data demodulating code detecting unit 24 in which a predetermined code which is capable of being demodulated even when an error is caused or which reduces error propagation, is detected and the detection result is outputted to the constraint length determining unit 31 and the error data demodulation/inverse conversion unit 32. The error data demodulating code detecting unit 24 includes a determining portion at the fourth stage having the constraint length "i" of 1 or 2 (that is, for executing the processing of FIG. 7), for example, shown by FIG. 8 and determines by referring to the demodulation table and outputs a predetermined detection signal to the constraint length determining unit 31 and the error data demodulation/inverse conversion unit 32.

The minimum run/maximum run compensating code detecting unit 23 is provided with a demodulation table of "x00-100-100-100" or "x10-100-100-100" of the table shown by Table 5 and when an inputted code word string 12 bits coincide therewith, the minimum run/maximum run compensating code detecting unit 23 outputs the constraint length i=4 as a detection signal to the constraint length determining unit 31.

The minimum run continuation restricting code detecting unit 22 is provided with a portion of a demodulation table of "x01 -000-000" in the table shown by Table 5 and when an inputted code word string 12 bits coincide with "x01-000-000 (not 100) ", the minimum run continuation restricting code detecting unit 22 outputs the constraint length i=3 as a detection signal to the constraint length determining unit 31.

Further, the constraint length determining unit 31 includes the demodulation table shown by Table 5 and determines the constraint length i=3 when an inputted code word string of 9 bits or 12 bits coincide with any of "x00-100-100", "x00-100-000-(not 100)", "x10-100-000" or "x10-100-000-(not 100)".

When not applicable to the above-described case, the constraint length determining unit 31 refers up to the maximum of 12 bits of an inputted code word string and respectively determines the constraint length as shown by Table 12.

TABLE 12

| Code | Constraint length |
|---|---|
| "101" | 1 |
| "100-000-000-100" | 2 |
| "100-000-(not 100)" | 2 |
| "100-(else)" | 1 |
| "011-001" | 1 |
| "011-(else)" | 1 |
| "x10-100" | 2 |
| "x10-000-(not 100)" | 2 |
| "x10-(not 000, 100)" | 1 |
| "000-000-(not 100)" | 2 |
| "x00-100" | 2 |
| "pre0-000-010" | 1 |
| "000-110" | 1 |
| "000-(else)" | 1 |

The error data demodulation/inverse conversion unit 31 is provided with a demodulation table as shown by FIG. 7 and converts all of data having the constraint length "i" of 1 or 2. In the meantime, the process shown by FIG. 8 is similar to the process shown by FIG. 5. The process shown by FIG. 5 uses the error data demodulating unit 12 and the demodulating unit 13 shown by FIG. 2.

FIG. 5 explains a specific example in Table 5 of the operations of error code/constraint length determining unit 21, the minimum run continuation restricting code detecting unit 22, the minimum run/maximum run compensating code detecting unit 23 and the error data demodulating code detecting unit 24.

The minimum run/maximum run compensating code detecting unit 23 is provided with a demodulating portion of "x00-100-100-l00" or "x10-100-100-100" of the table shown by Table 5 and outputs the constraint length i=4 as a detection signal to the constraint length determining unit 21 when an inputted code word string 12 bits coincide therewith.

The minimum run continuation restricting code detecting unit 22 is provided with a demodulating portion of "x01-000-000" of the table shown by Table 5 and outputs the constraint length i=3 as a detection signal to the constraint length determining unit 21 when an inputted code word string 12 bits coincide with "x01-000-000-(not 100)".

Further, the constraint length determining unit 31 includes the demodulation table shown by Table 5 and determines the constraint length i=3 when 9 bits or 12 bits of an inputted code word string coincide with any of "x00-100-100", "x00-100-000-(not 100)", "x10-100-100" or "x10-100-000-(not 100)".

When not applicable to the case, the constraint length determining unit 31 determines the constraint length i=2 when 9 bits or 12 bits of an inputted code word string coincides with any of "x10-100", "x10-000-(not 100)" or "x00-100". Further, when not applicable to the case, the constraint length determining unit 31 determines the constraint length i=1 when 3 bits of an inputted code word string coincides with any of "000-(not 000-(not 100))", "000-(not 110)", not (pre "0"-"000-010"), "101", "001-(not 100)" or "x10".

Further, when not applicable to the above-described determination, the constraint length determining unit 31 determines that an error is caused, transmits a signal to the multiplexer 27, further, when a code word string inputted to the error data demodulating code detecting unit 24 coincides with any of "100-000-000-100", "100-000-(not 100)", "100-(else)", "011-001", "011-(else)", "001-100", "000-000-(not 100)", "pre0-000-010" or "000-110", the constraint length determining unit 31 outputs a respectively corresponding detection signal to the error data demodulation table 25 as error data. The respective constraint lengths "i" at the error data demodulating code detecting unit 24 are as shown by FIG. 6.

Further, the processing of determining the constraint length of the constraint length determining unit 21, the minimum run continuation restricting code detecting unit 22 and the minimum run/maximum run compensating code detecting unit 23 may be carried out in an order of smaller ones of the constraint lengths "i" such that i=1, i=2, i=3 and i=4 other than those shown by FIG. 5 and FIG. 8 and also in this case, the constraint length is similarly determined.

In the meantime, in the case in which the constraint lengths are determined in an order from smaller ones thereof such that i=1, i=2, i=3 and i=4, for example, in the case of an inputted code word string of "000-100-100-100", if the constraint length determining unit 21 determines coincidence/incoincidence in an order of smaller ones of the constraint lengths "i", the determination is applied to all of constraint lengths of constraint length i=1 or constraint length i=2, constraint length i=3 and constraint length i=4 and accordingly, a maximum one is selected from the constraint lengths.

Back to FIG. 9, the inverse conversion units 24-3 and 26-4 are respectively written with data in correspondence with the constraint length "i" of 3 or 4 of Table 10, converts a supplied code word string of 3i bits into a data string of 2i bits and outputs the data string to the multiplexer 27.

The multiplexer 27 selects data in correspondence with the result of determining the constraint length outputted from the constraint length determining unit 31 from data supplied from the error data demodulation/inverse conversion unit 32 and the inverse conversion units 24-3 and 26-4 and outputs the data as serial data.

Table 13 is a demodulation table of Table 5 when including error data demodulating code detection in the processing having the constraint length "i" of 1 or 2 in FIG. 7 and FIG. 8.

TABLE 13

Demodulation table (1,7;2,3;4)

| Code | Demodulation data |
|---|---|
| i=1,2 | |
| 101 | 11 |
| (ER) 100 000 000 100 | 0010 |
| (ER) 100 000 (not 100) | 0000 |
| (ER) 100 (else) | 11 |
| (ER) 011 001 | 01 |
| (ER) 011 (else) | 00 |
| x10 100 | 0011 |
| x10 000 (not 100) | 0010 |
| x10 (not 000, 100) | 01 |
| (ER) 001 100 | 00 |
| 001 (else) | 10 |
| (ER) 000 000 (not 100) | 0000 |
| x01 100 | 0001 |
| (ER) pre0 000 010 | 00 |
| (ER) 000 110 | 10 |
| 000 (else) | 11 |
| i=3 x00 100 100 000011 | |
| x00 100 000(not 100) | 000010 |
| x10 100 100 000001 | |
| x10 100 000(not 100) | 000000 |
| i=3 : Prohibit Repeated Minimum Transition Runlength | |
| x01 000 000(not 100) 1110111 | |
| i=4 : limits k to 7 | |

TABLE 13-continued

Demodulation table (1,7;2,3;4)

| Code | Demodulation data |
|---|---|
| x01 100 100 100 | 00001000 |
| x10 100 100 100 | 00000000 |
| (x: 0 or 1) | |

Although in respect of the above-described operation, a specific example has been shown as the demodulation table in correspondence with Table 5, this can also similarly be constituted as a demodulation table in correspondence with Table 6.

Table 14 shows an example of a demodulation table including error data demodulating portions. Table 15 shows a demodulation table in correspondence with error data of the error data demodulating portions. Table 16 shows a conventional demodulation table having no error data demodulating portions.

TABLE 14

Demodulation table (1,7;2,3;4)

| Code | Demodulation data |
|---|---|
| r=1 Main table: | |
| 101 | 00 |
| 100 | 01 |
| 001 | 10 |
| 000 | 11 |
| (ER) 110 | 00 |
| (ER) 011 | 00 |
| (ER) 010 | 01 |
| r=2 substitution table A. (limits d to 1) | |
| 100 010 | 0000 |
| 101 01x | 0001 |
| 000 010 | 1000 |
| 001 01x | 1001 |
| r=3 substitution table B. (limits k to 8) | |
| 000 010 010 | 111111 |
| 001 010 010 | 111110 |
| 101 010 010 | 011110 |
| 100 010 010 | 011111 |
| (ER) 010 010 010 | 010001 |
| r=4 substitution table C. (limits RMTR to 6) | |
| 100 010 010 010 00010001 | |
| 100 000 010 010 10010001 | |
| 000 010 010 010 10010001 | |
| r=4 substitution table D. (limits k to 7) | |
| 000 001 010 010 11100000 | |
| 100 001 010 010 11100010 | |
| 001 010 010 010 11100001 | |
| 101 010 010 010 11100000 | |
| (ER) 110 010 010 010 11100000 | |
| (ER) 011 010 010 010 11100000 | |

TABLE 15

Demodulation table of error data demodulating portion (1,7;2,3;4)

| Code | Demodulation data |
|---|---|
| i=1 110 | 00 |
| 011 | 00 |
| 010 | 01 |
| i=2 101 011 | 0001 |
| 001 011 | 1001 |
| i=3 010 010 010 | 010001 |

TABLE 15-continued

Demodulation table of error data demodulating portion (1,7;2,3;4)

| Code | Demodulation data |
|---|---|
| r=4 110 010 010 010 11100000 | |
| 011 010 010 010 11100000 | |

TABLE 16

Demodulation table (1,7;2,3;4)

| Code | Demodulation data |
|---|---|
| r=1 Main table: | |
| 101 | 00 |
| 100 | 01 |
| 001 | 10 |
| 000 | 11 |
| r=2 substitution table A. (limits d to 1) | |
| 100 010 | 0000 |
| 101 010 | 0001 |
| 000 010 | 1000 |
| 001 010 | 1001 |
| r=3 substitution table B. (limits k to 8) | |
| 000 010 010 | 111111 |
| 001 010 010 | 111110 |
| 101 010 010 | 011110 |
| 100 010 010 | 011111 |
| r=4 substitution table C. (limits RMTR to 6) | |
| 100 010 010 010 00010001 | |
| 100 000 010 010 10010001 | |
| 000 010 010 010 10010001 | |
| r=4 substitution table D. (limits k to 7) | |
| 000 001 010 010 11100000 | |
| 100 001 010 010 11100010 | |
| 001 010 010 010 11100001 | |

Figure 10:
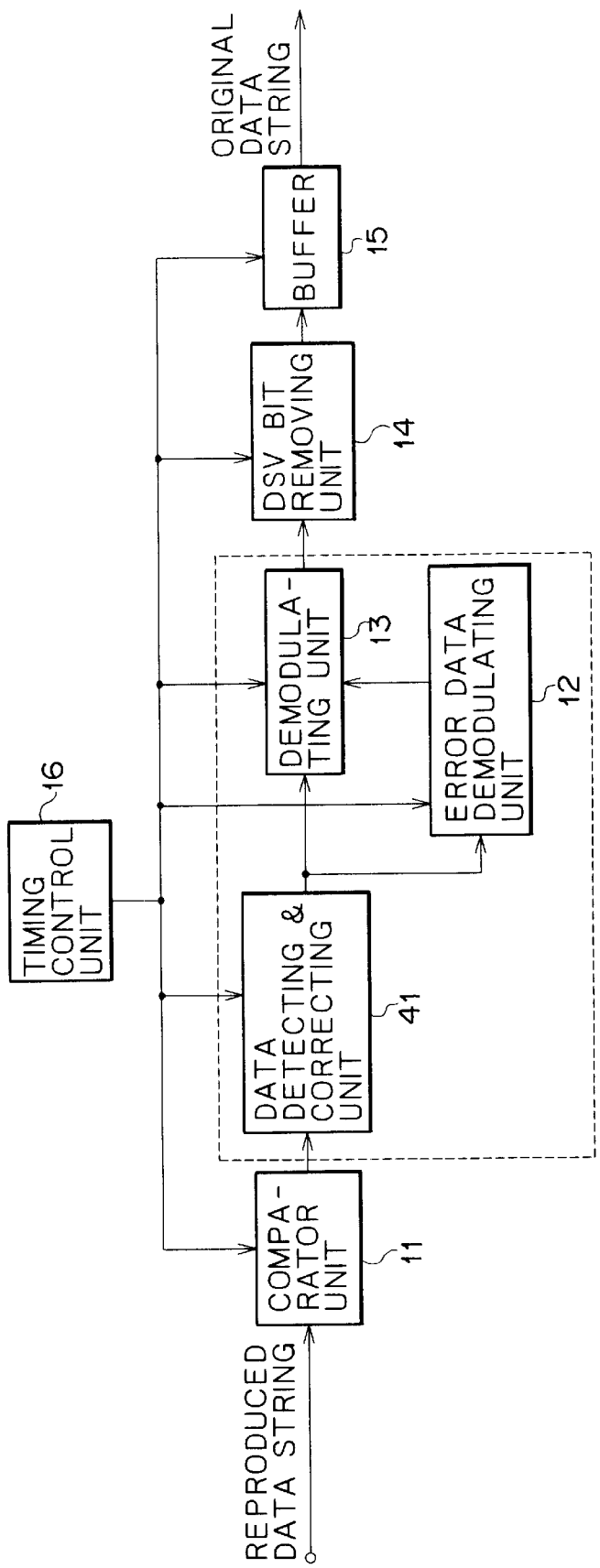
FIG. 10 is a block diagram showing a constitution of an embodiment of a demodulating device when means for reducing error such as an run error correction is used.

FIG. 10 is a block diagram showing a constitution of other embodiment of a total of a demodulating device when using means for reducing error such as Viterbi decoding, Run-detector and run error correction or the like. As shown by FIG. 10, a data detecting and correcting unit 41 is installed at a pre-stage of the demodulating unit 13 and Viterbi decoding or the like may be carried out at the data detecting and correcting unit 41.

FIG. 11 is a block diagram showing detailed constitutions of the data detecting and correcting unit 41, the demodulating unit 13 and the error data demodulating unit 12. As shown by FIG. 11, the data detecting and correcting unit 41 is connected in series with the demodulating unit 13 and the error data demodulating unit 12. Operation of the demodulating unit 13 and the error data demodulating unit 12 is similar to the above-described.

A result of simulation for confirming the effect of the present invention will be shown. According to the procedure of the simulation, firstly, based on Table 5, continuation of Tmin is restricted and a code word string modulating a data string inserted with DSV control bits in the data string is formed. Next, shift error is caused in the forward direction and in the rearward direction from the code word string to an arbitrary position. Further, a code word string including error is demodulated in two ways of a case using the system and a case of not using the system and both are compared with each other. A result of demodulation is evaluated by to what data word the error is propagated by causing the error at one location.

A code word string (channel bit string) is produced from arbitrarily formed random data of 13107200 bits by using the demodulation code table of Table 5 and inserting DSV control bits at intervals of 56 data bits by carrying out DSV control. It is confirmed that the produced code word string is controlled by DSV control. Further, an average run length is 3.366 channel bit. Further, a minimum run 2T and a maximum run 8T are confirmed. Further, it is confirmed that the minimum run 2T continues up to 6 times at maximum.

Further, a result of causing shift error at arbitrary intervals in the channel bit string provided as described above is as shown by Table 17. In this case, byte errors (0) through (3) are indicated by respective rates of appearance.

TABLE 17

Demodulation error propagation characteristic in bit shift
Part 1
Shift error response

|  | (Table. 5) | (Table. 5) | (Table. 5) |
|---|---|---|---|
| Method of Fig. 3 | None | Present | Present |
| Method of Fig. 5 (Fig. 8) | None | Present | Present |
| worst case (dc bit) | 3 Bytes in. | 3 Bytes in. | 3 Bytes in. |
| Byte error (0) | 0.0282 | 0.0282 | 0.1313 |
| Byte error (1) | 0.7472 | 0.7768 | 0.6795 |
| Byte error (2) | 0.2238 | 0.1944 | 0.1887 |
| Byte error (3) | 0.0006 | 0.0003 | 0.0003 |
| Average - Byte error rate | 1.1968 Byte | 1.1668 Byte | 1.0581 Byte |
| (Average) bit error rate | 3.1320 bit | 2.8496 bit | 2.6148 bit |

It is confirmed from the result of Table 17 that the two methods of error data demodulation of the present invention reduce occurrence of large Byte-error, that is, error correction in bit shift can effectively be carried out. Further, it is confirmed that also in the average error propagation, propagated values are reduced both in byte-error (error when bits are divided by a unit of 8data) and bit-error.

Further, the worst error propagation of Table 5 is 3 bytes whereas, for example, the worst error propagation is 2 bytes in the case of conventional RLL (1, 7) code of Table 1 which is similarly a code of maximum run d=1. Further, the maximum value of Table 3 is 2 bytes. However, as shown by the result of simulation, actual occurrence of error propagation of 3 bytes in Table 5 is 1 or less per 1000, which is very small.

Further, a result of the case to which the present invention is applied after providing run error correction as the embodiment shown by FIG. 10 and FIG. 11, is as shown by Table 18 and the most preferable result is obtained.

TABLE 18

Demodulation error propagation characteristic in bit shift
Part 2
Shift error response

|  | (Table. 5) | (Table. 5) | (Table. 5) |
|---|---|---|---|
| Method of Fig. 3 | None | Present | Present |
| Method of Fig. 5 (Fig. 8) | None | Present | Present |
| Run error correction | None | None | Present |
| worst case (dc bit) | 3 Bytes in. | 3 Bytes in. | 3 Bytes in. |
| Byte error (0) | 0.0282 | 0.1313 | 0.1739 |
| Byte error (1) | 0.7472 | 0.6795 | 0.6403 |
| Byte error (2) | 0.2238 | 0.1687 | 0.1854 |
| Byte error (3) | 0.0006 | 0.0003 | 0.0003 |

TABLE 18-continued

Demodulation error propagation characteristic in bit shift
Part 2
Shift error response

|  | (Table. 5) | (Table. 5) | (Table. 5) |
|---|---|---|---|
| Average - Byte error rate | 1.1968 Byte | 1.0581 Byte | 1.0121 Byte |
| (Average) bit error rate | 3.1320 bit | 2.6148 bit | 2.5382 bit |

Further, a numerical value of the result of the above-described error rate is a value including 1 bit of the DSV bit (that is, a value outputted from the demodulating unit 13 of the block diagram of the demodulating device in FIG. 1) and to constitute an actual data string, 1 bit of the DSV bit needs to further remove. Therefore, the error propagation characteristic of the data string is varied more or less therefrom. Generally, an average value of error propagation is improved from the above-described result. At any rate, as a result of applying the present invention, error is reduced and average error propagation is also improved.

Further, Table 19 shows a result in the case in which run error correction which is the embodiment of FIG. 10 and FIG. 11 similarly immediately therebefore and Table 19 is improved compared with either of Table 17 and Table 18.

TABLE 19

Demodulation error propagation characteristic in bit shift
Part 3
shift error response

|  | (Table. 5) | (Table. 5) | (Table. 5) | (Table. 5) |
|---|---|---|---|---|
| Method of Fig. 3 | None | Present | Present | Present |
| Method of Fig. 5 (Fig. 8) | None | None | Present | Present |
| Run error correction | None | None | None | Present |
| (dc bit) | out. | out. | out. | out. |
| Byte error (0) | 0.0302 | 0.0389 | 0.1361 | 0.1766 |
| Byte error (1) | 0.7921 | 0.8032 | 0.7094 | 0.6721 |
| Byte error (2) | 0.1770 | 0.1575 | 0.1541 | 0.1498 |
| Byte error (3) | 0.0005 | 0.0003 | 0.0002 | 0.0002 |
| Average - Byte error rate | 1.1479 Byte | 1.1191 Byte | 1.0184 Byte | 0.9726 Byte |
| (Average) bit error rate | 2.8505 bit | 2.6110 bit | 2.3986 bit | 2.3268 bit |

As mentioned above, according to the demodulating device of the present invention, in a code as shown by Table 5 which is RLL code string having the minimum run "d" of 1 or more, even when error is included, by demodulating the code such that the code is not mistaken for other, demodulation error by bit shift can be reduced and the average error rate can be improved.

Further, in this specification, a system represents a total of apparatus constituted by a plurality of devices.

Further, as a supply medium for supplying a computer program for carrying out the above-described processing to a user, there can be utilized communication media such as a network, a satellite or the like other than record media of a magnetic disk, CD-ROM, a solid-state memory and so on.

According to the demodulating device, the demodulating method and the supply medium specified in claims 1, 2 and 5, a constraint length of a code having a predetermined length including an error is specified and the code is demodulated based on the specified constraint length and accordingly, when bit shift error is caused, error propagation can be reduced by a simpler constitution.

According to the demodulating device, demodulating method and the supply medium specified by claims 7, 9 and 10, a code is demodulated by using a demodulation table in correspondence with a code having a predetermined length including an error and accordingly, when bit shift error is caused, error propagation can be reduced by a simpler constitution.

What is claimed is:

1. A demodulating device for demodulating a supplied input code into data, wherein said code is represented as a variable length code derived from predetermined conversion tables, and said variable length code (d, k; m, n; r) has a minimum run d of at least 1, a basic code length of n bits, a run length restriction and a constraint length, and said data has a basic data length of m bits, said demodulating device comprising:

constraint length specifying means for specifying the constraint length of the code having a predetermined length including an error; and demodulating means having inverse conversion tables corresponding to the inverse of said conversion tables for demodulating the code based on the constraint length specified by the constraint length specifying means, said demodulating means having, means selectable by the specified constraint length for demodulating a supplied input code that is subjected to bit shift error Such that said supplied input code no longer is included in said inverse conversion tables.

2. The demodulating device according to claim 1:

wherein the demodulating means demodulates probable data based on the constraint length specified by the constraint length specifying means.

3. The demodulating device according to claim 1:

wherein the constraint length specifying means specifies the constraint length by disregarding a value of a front one bit of a code having the predetermined length.

4. A demodulating method for demodulating a supplied input code into data, wherein said code is represented as a variable length code derived from predetermined conversion tables, said variable length code (d, k; m, n; r) has a minimum run d of at least 1, a basic code length of n bits, a run length restriction and a constraint length, and said data has a basic data length of m bits, said demodulating method comprising the steps of:

specifying the constraint length of the code having a predetermined length including an error;

demodulating the code, using inverse conversion tables corresponding to the inverse of said conversion tables, based on the specified constraint length; and demodulating a supplied input code that is subjected to bit shift error such that said supplied input code no longer is included in said inverse conversion tables.

5. A supply medium for supplying a computer-readable program for executing a processing to a demodulating device for demodulating a supplied input code into data, wherein said code is represented as a variable length code derived from predetermined conversion tables, said variable length code (d, k; m, n; r) has a minimum run d of at least 1, a basic code length of n bits, a run length restriction and a constraint length, and said data has a basic data length of m bits, said computer-readable program controlling the demodulating device to:

specify the constraint length of the code having a predetermined length including an error;

demodulate the code, using inverse conversion tables corresponding to the inverse of said conversion tables, based on the specified constraint length; and demodulate a supplied input code that is subjected to bit shift error such that said supplied input code no longer is included in said inverse conversion tables.

* * * * *